(12) United States Patent
Liu et al.

(10) Patent No.: US 7,898,724 B2
(45) Date of Patent: Mar. 1, 2011

(54) THERMAL CONDUCTION BY ENCAPSULATION

(75) Inventors: Jane Qian Liu, Plano, TX (US); Frank Armstrong, Wylie, TX (US); Edward Carl Fisher, Lucas, TX (US); Scott Patrick Overmann, Allen, TX (US); Leatrice Lea Gallman Adams, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 123 days.

(21) Appl. No.: 12/264,996

(22) Filed: Nov. 5, 2008

(65) Prior Publication Data

US 2010/0110527 A1     May 6, 2010

(51) Int. Cl.
*G02B 26/00* (2006.01)
*H01L 23/48* (2006.01)

(52) U.S. Cl. .................................. 359/291; 257/735

(58) Field of Classification Search ......... 359/290–295, 359/237–245; 257/728–735.7, 7; 438/106, 438/118, 124, 462, 51
See application file for complete search history.

(56) References Cited

U.S. PATENT DOCUMENTS 5,904,496 A * 5/1999 Richards et al. ............. 438/106

* cited by examiner

*Primary Examiner*—Mohammed Hasan
(74) *Attorney, Agent, or Firm*—Charles A. Brill; Wade James Brady, III; Frederick J. Telecky, Jr.

(57) ABSTRACT

A packaged electronic device includes a substrate with an upper surface interrupted by a well formed in the substrate. The well has a substrate bottom surface and a substrate sidewall. An electronic device is located in the well over the substrate bottom surface and has a device top surface and a device sidewall. A trench is bounded by the substrate bottom surface, the substrate sidewall and the device sidewall. An encapsulant at least partially fills the trench and contacts the substrate sidewall and the device sidewall. The encapsulant has a first elevation on the substrate sidewall with respect to the substrate bottom surface and a second elevation on the substrate device sidewall with respect to the substrate bottom surface that is at least about 35% greater than the first elevation.

20 Claims, 8 Drawing Sheets

US 7,898,724 B2

THERMAL CONDUCTION BY ENCAPSULATION

TECHNICAL FIELD

This disclosure is directed, in general, to packaging of electronic devices and, more specifically, to decreasing thermal resistance between an electronic device and a package.

BACKGROUND

In some electronic devices, one or more components of the device may be sensitive to the instantaneous or time-average temperature thereof. For example, an oscillator may have a characteristic frequency that depends on temperature, or a packaging component may degrade if the temperature thereof exceeds a threshold value. It is therefore sometimes necessary to limit one or more device operational parameters to reduce the temperature of sensitive components. Such limitations are undesirable where a lower performance results.

SUMMARY

In one embodiment, a packaged electronic device includes a substrate with an upper surface interrupted by a well formed in the substrate. The well has a substrate bottom surface and a substrate sidewall. An electronic device is located in the well over the substrate bottom surface, and has a device top surface and a device sidewall. A trench is bounded by the substrate bottom surface, the substrate sidewall and the device sidewall. An encapsulant at least partially fills the trench and contacts the substrate sidewall and the device sidewall. The encapsulant has a first elevation on the substrate sidewall with respect to the substrate bottom surface and a second elevation on the substrate device sidewall with respect to the substrate bottom surface that is at least about 35% greater than the first elevation.

In another embodiment, a method of packaging an electronic device is provided. In one step the method provides a substrate having an upper surface interrupted by a well formed in the substrate, the well having a lower substrate surface and a substrate sidewall. In another step an electronic device is located over in the well and has a device top surface and a device sidewall. In another step an encapsulant is dispensed in a trench bounded by the lower substrate surface, the substrate sidewall and the device sidewall. The encapsulant contacts the substrate sidewall and the device sidewall and has a first elevation with respect to the substrate sidewall and a second elevation with respect to the device sidewall being at least about 35% greater than the first elevation.

Another embodiment provides a packaged digital reconfigurable mirror array that includes a substrate having an upper surface interrupted by a well formed in the substrate. The well has a sidewall and a lower substrate surface. A glass plate is located over the well and has a sidewall, a top surface and a bottom surface. An elevation of the top surface above the lower substrate surface is greater than an elevation of the upper substrate surface above the lower substrate surface. A digital reconfigurable mirror array device is located between the glass plate and the substrate. A trench is located between the substrate sidewall and the glass sidewall, and an encapsulant at least partially fills the trench. The encapsulant forms a first contact point with the substrate sidewall and a second contact point with the glass plate sidewall. An elevation of the second contact point above the lower substrate surface is at least about 0.5 mm greater than an elevation of the first contact point above the lower substrate surface.

BRIEF DESCRIPTION OF THE DRAWINGS

For a more complete understanding of the disclosure, reference is now made to the following descriptions taken in conjunction with the accompanying drawings, in which.

DETAILED DESCRIPTION

A heat sink is typically used to reduce thermal resistance between an electronic device and a coolant, e.g., air or a thermal mass. In some cases, a heat sink is impractical, expensive, or mechanically interferes with a desired system configuration. In such cases, an alternate means of decreasing thermal resistance between the device and the coolant may be needed. This need may be particularly acute when a low-cost packaging solution is desired, or when the electronic device includes a window that precludes mounting a heat sink to an upper surface of the device.

Embodiments herein recognize that an encapsulant used in a process of packaging the device on a substrate may be configured to reduce thermal resistance between the device and the substrate. The lower thermal resistance may then obviate the need for a more expensive means of removing waste heat from the device, or may allow the device to operate in a desired manner that causes waste heat to be generated at a greater rate.

Figure 1A:
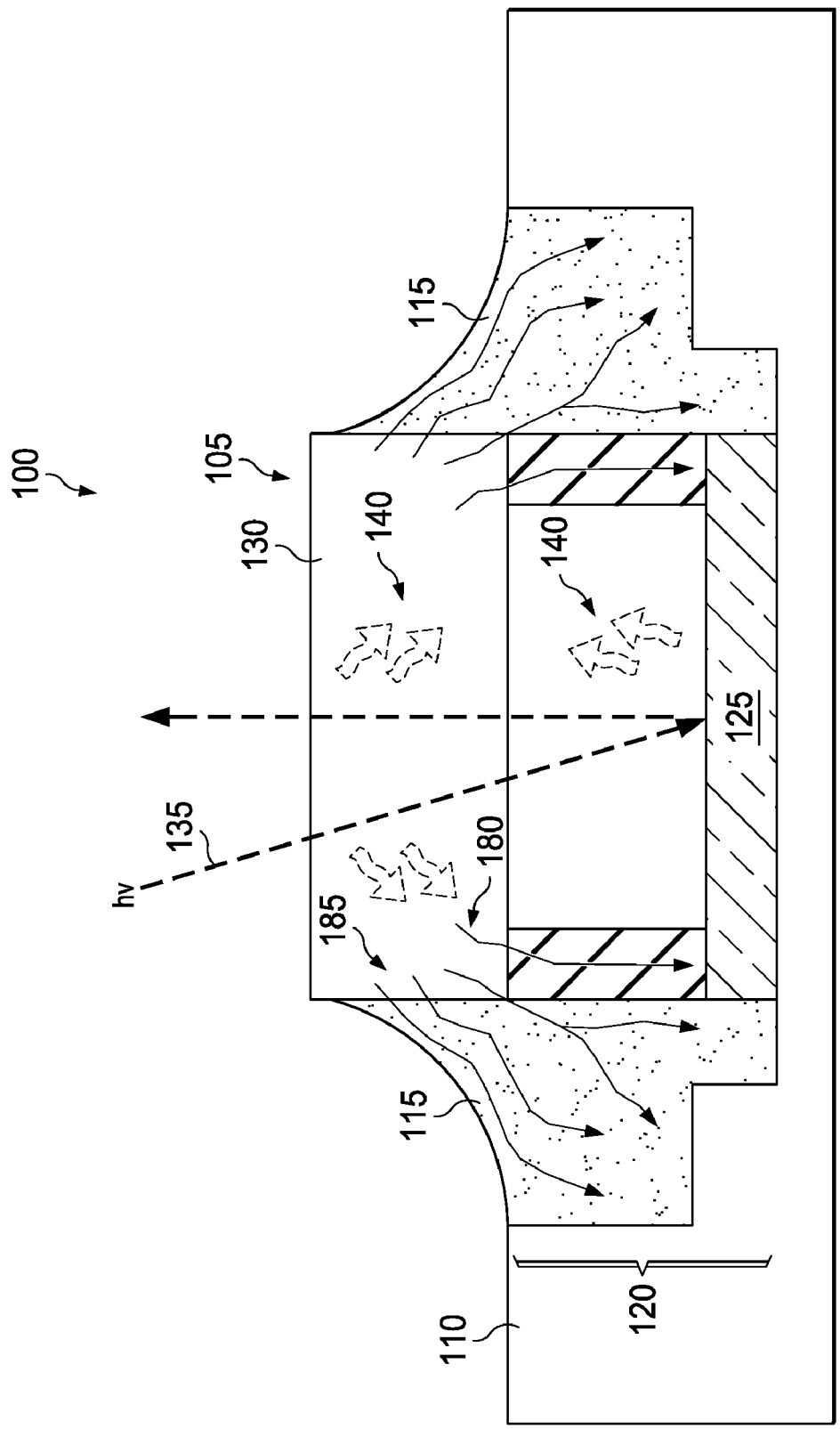
FIGS. 1A-1D illustrate a packaged electronic device according to the disclosure.

Turning to FIG. 1A, illustrated is a packaged electronic device 100 according to the disclosure, hereinafter packaged device 100 for brevity. The packaged device 100 includes an electronic device 105 located over a substrate 110. An encapsulant 115 at least partially fills a trench 120 bounded by the substrate 110 and the device 105. As a nonlimiting example, the device 105 is illustrated as including a digital micromirror device (DMD), including a digital reconfigurable mirror array 125 and a window 130. While embodiments described herein are advantageous in applications wherein the device 105 is a DMD, the embodiments may be practiced with any electronic device within the scope of the disclosure.

The device 105 will typically dissipate heat when operating. In embodiments including the mirror array 125, a light beam 135 projects through the window 130 and is reflected from individual mirrors of the mirror array 125. When the beam 135 passes through the window 130, some light is typically converted to heat 140, e.g., because the transmittance of the window is less than unity.

It is generally desirable to limit the temperature rise of the device 105 during operation to avoid damaging temperature-sensitive components therein. In some cases, the need to limit the temperature rise is critical to, e.g., maintain operability of the electronic component for its rated lifetime or to operate in a desired operating regime not otherwise sustainable. The temperature rise of the window 130 may in some cases place such sensitive subcomponents of the packaged device 100 at risk, or otherwise limit the operation of the packaged device 100.

Figure 1B:
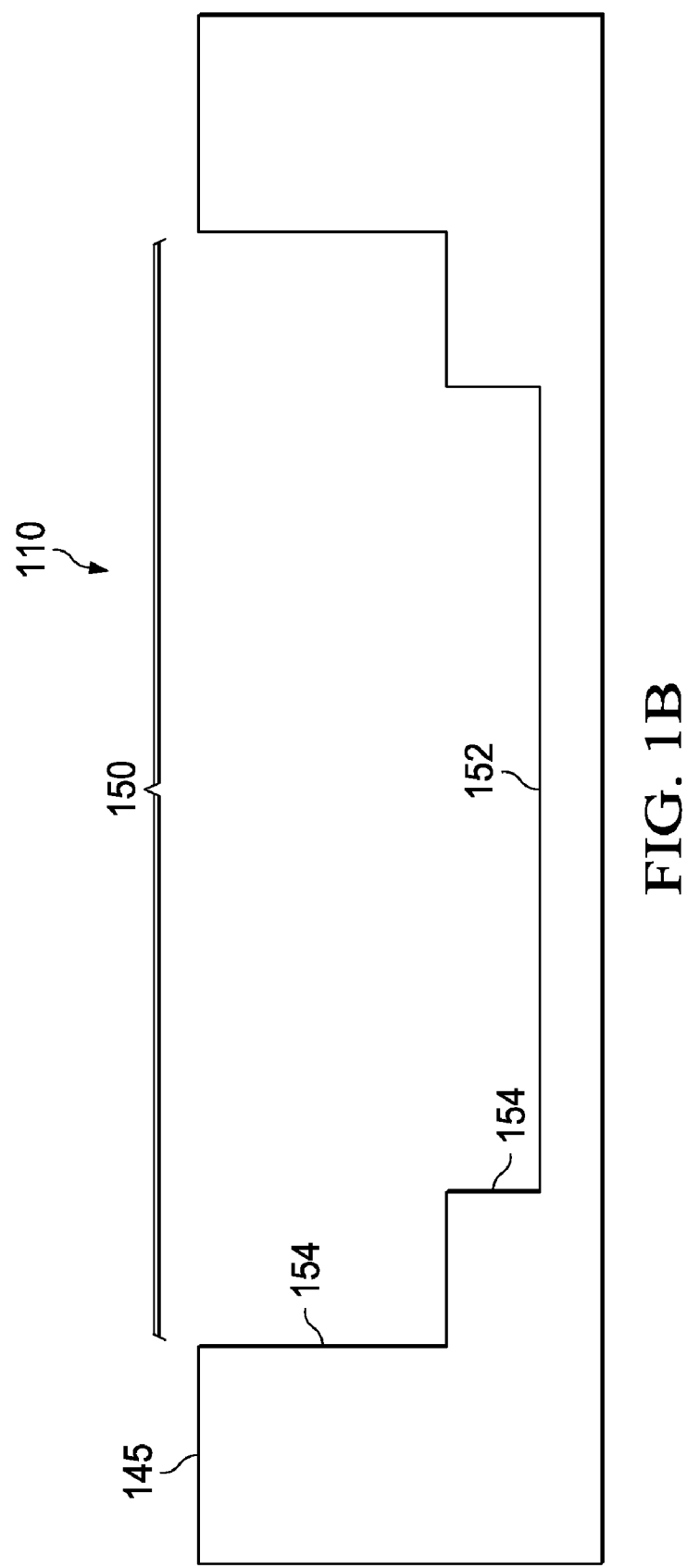

Turning briefly to FIG. 1B, the substrate 110 is illustrated in isolation for clarity describing the elements thereof. The substrate 110 has an upper substrate surface 145 that is interrupted by a well 150. The well 150 includes a lower substrate surface 152 and a substrate sidewall 154. In the illustrated embodiment, the substrate sidewall 154 is discontinuous, while in other embodiments, the substrate sidewall 154 may be continuous.

Figure 1C:
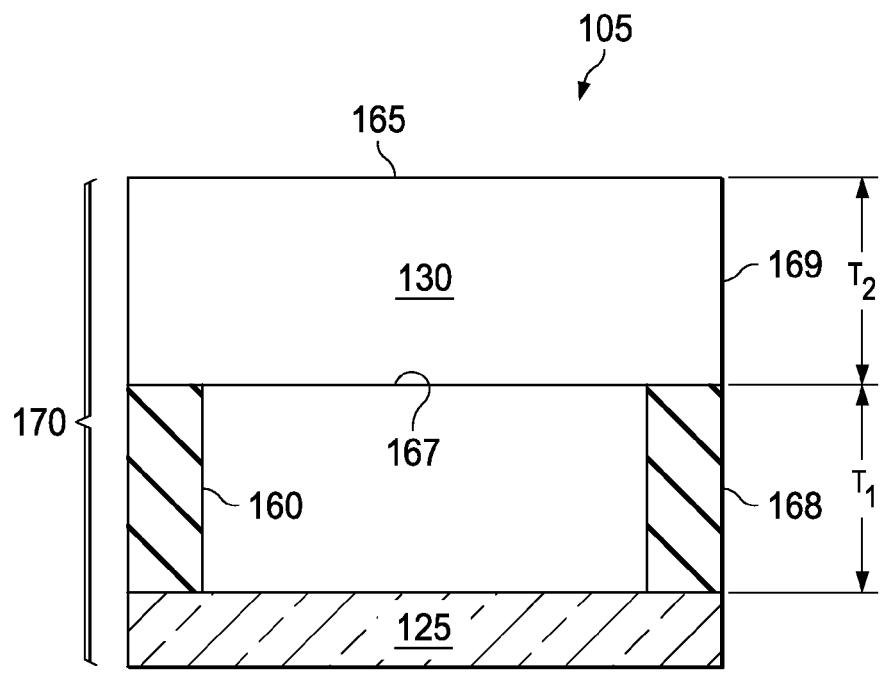

Next turning briefly to FIG. 1C, the electronic device 105 is illustrated in isolation for clarity. The electronic device 105, illustrated as a DMD, e.g., includes spacers 160 between the mirror array 125 and the window 130, each having a thickness $T_1$ and a side surface 168. The window 130 has a thickness $T_2$, and includes a top surface 165, a bottom surface 167, and a side surface 169. The device 105 has a device sidewall 170 that includes vertical surfaces of the mirror array 125, the spacer 160 and the window 130.

Figure 1D:
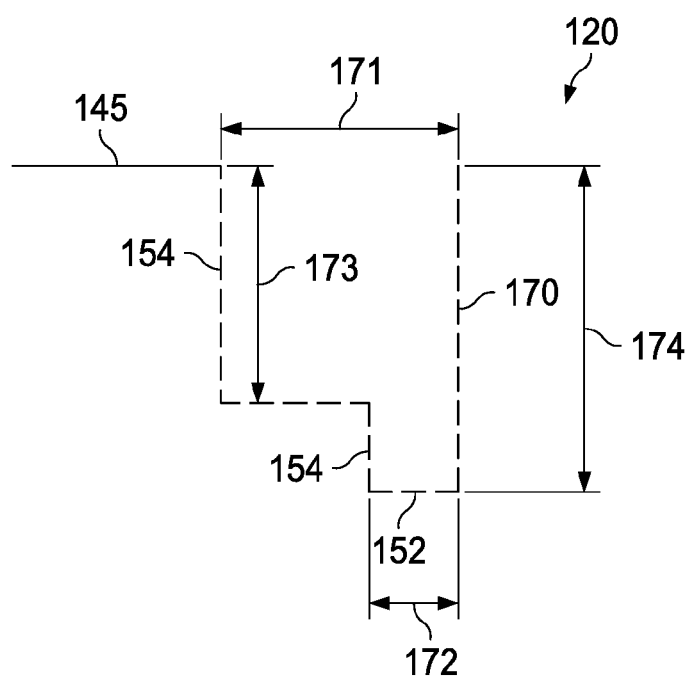

FIG. 1D illustrates an outline of the trench 120 for clarity. The trench 120 is defined as the portion of the well 150 bounded by the substrate sidewall 154, the lower substrate surface 152 and that portion of the device sidewall 170 with equal or lower elevation to the upper substrate surface 145. A first width 171, a second width 172, and first depth 173 and a second depth 174 are defined as illustrated for later reference.

Figure 2:
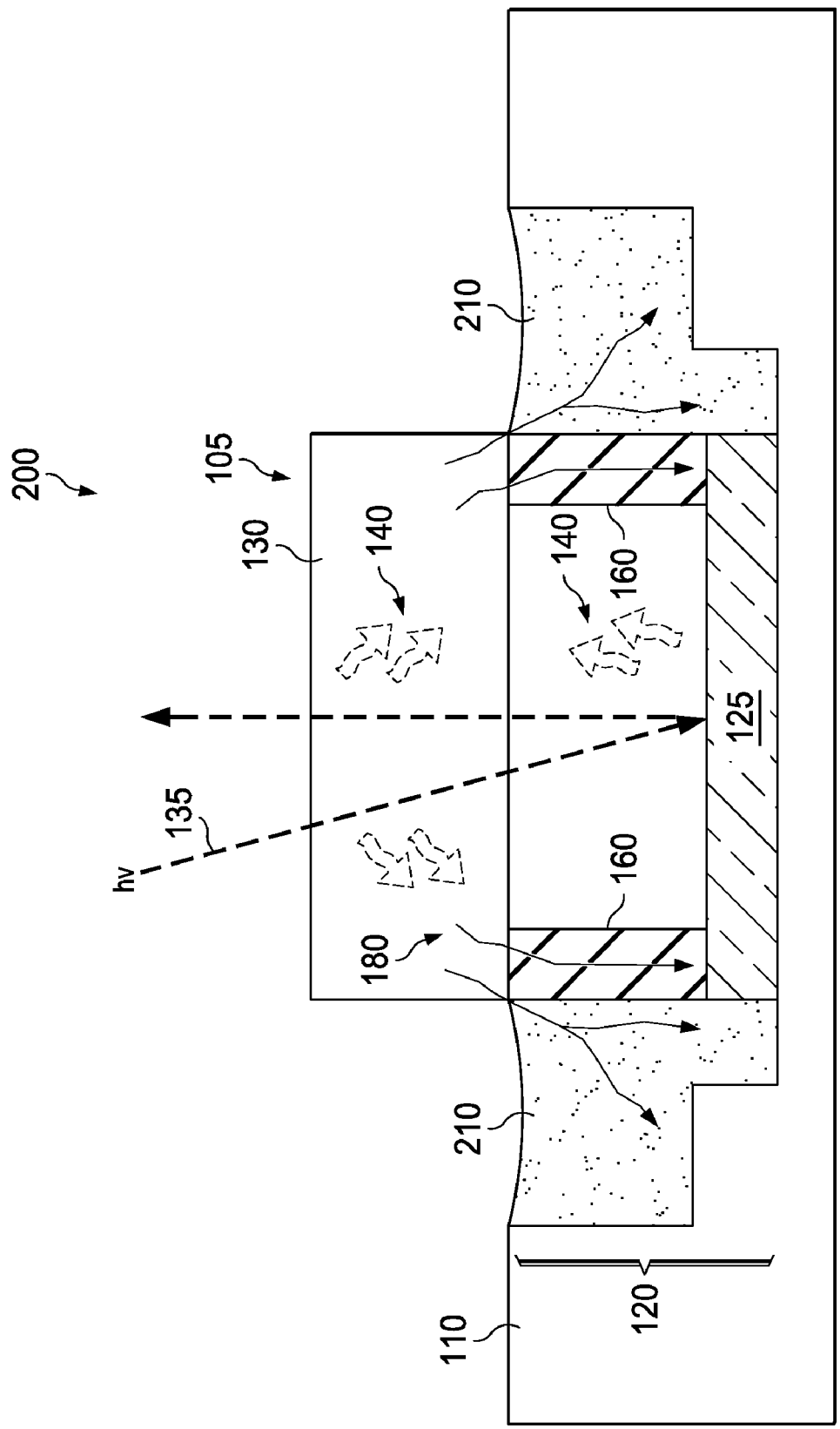
FIG. 2 illustrates a prior art packaged electronic device.

Turning to FIG. 2, a conventional configuration 200 of the packaged device 105 is illustrated with a prior art configuration of an encapsulant 210. During operation, energy absorbed by the window 130 may cause the temperature of the window 130 to rise above that of the substrate 110. The extent of the temperature rise is determined in part by the thermal resistance of various conductive paths 180 from the window 130 to the substrate 110. One thermal path is through the spacers 160, and another is through the encapsulant 210.

The path of the heat flow from the window 130 is initially narrow, limited by the contact area between the window 130 and the spacer 160. From the spacer 160, heat may flow into the encapsulant 210, creating a wider heat flow path. Thus, the heat flow from the window 130 is constrained by the contact area between the window 130 and the spacer 160. Increasing the contact area between the spacer 160 and the window 130 is either undesirable or infeasible due to, e.g., greater package size or increased cost of spacer material. Increasing the depth of the trench 120 to provide a lateral heat flow path from the window 130 into the encapsulant 210 is also undesirable due to, e.g., increased package costs. Moreover, providing a heat sink would add cost and could obstruct the light beam 135.

Returning to FIG. 1A with continuing reference to FIG. 1C, the encapsulant 115 is configured to provide greater thermal contact with the side surface 169 of the window 130 than does the prior art encapsulant 210. Embodiments presented herein provide improved conduction of heat from the device 105 to the substrate 110. It is recognized herein that heat flow from the window 130 may be increased by configuring the encapsulant 115 to be in thermal contact with a substantial portion of the side surface 169 of the window 130. Substantial in this context means at least about 50% or more. The thermal contact provides a thermal path 185 through which heat may flow from the window 130 to the substrate 110. The thermal path 185 provides thermal conduction parallel to the thermal path 180, thus reducing the thermal resistance between the window 130 and the substrate 110. The reduced thermal resistance may be exploited to, e.g., increase the thermal load that may be imposed on the window 130 by the beam 135, increase the operating lifetime of the packaged device 100, or both.

Figure 3:
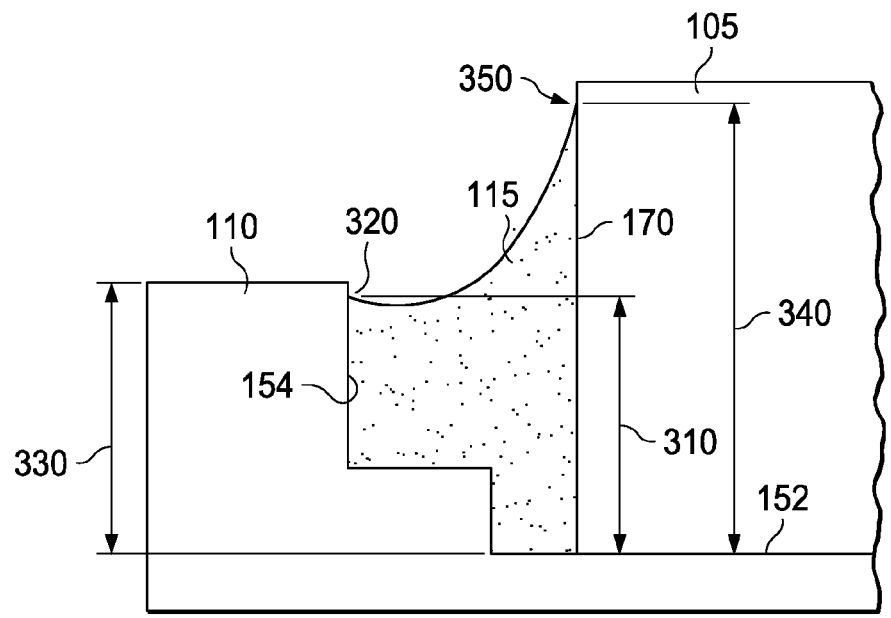
FIGS. 3, 4A and 4B illustrate various aspects of an encapsulant configured according to the disclosure.

FIG. 3 illustrates a detail view of the encapsulant 115 proximate the device 105. The encapsulant 115 contacts the substrate sidewall 154 with an elevation 310 taken with respect to the lower substrate surface 152. An uppermost extent at which the encapsulant 115 contacts the substrate sidewall 154 is referred to herein as the substrate contact point 320. In some applications, as illustrated, the elevation 310 is less than a depth 330 of the well 150. In other cases, the elevation 310 may be about equal to or greater than the depth 330. However, in some cases it may be undesirable for the elevation 310 to exceed the depth 330 due to the possibility of uncured encapsulant being inadvertently placed in an undesirable location.

The encapsulant 115 contacts the device sidewall 170 with an elevation 340 measured in relation to the lower substrate surface 152. An uppermost extent at which the encapsulant 115 contacts the device sidewall 170 is referred to herein as the device contact point 350. The elevation 340 is at least about 35% greater than the elevation 310. It is believed that by providing at least about 35% greater elevation of the encapsulant 115 on the device sidewall 170, the thermal resistance between the device 105 and the substrate 110 is significantly reduced relative to conventional configurations of the encapsulant, e.g., the encapsulant 210. The advantage conferred by reduced thermal resistance is expected to be even greater when the elevation 340 is at least about 50% greater than the elevation 310.

When the device 105 includes a window, such as the window 130, e.g., the extent of coverage of the device sidewall 170 may be expressed as an extent of coverage of the window 130. Without limitation, in some embodiments the encapsulant 115 covers at least about 0.4 mm of the side surface 169 of the window 130, e.g. In some cases, the encapsulant 115 covers at least about 50% of the side surface 169. The lower thermal resistance may result in additional benefit when the encapsulant 115 covers at least about 0.5 mm of the side surface 169, or in some cases at least about 75% of the side surface 169. Additional benefit may be obtained when the encapsulant 115 covers at least about 0.9 mm, or about 90% of the side surface 169.

Figure 4A:
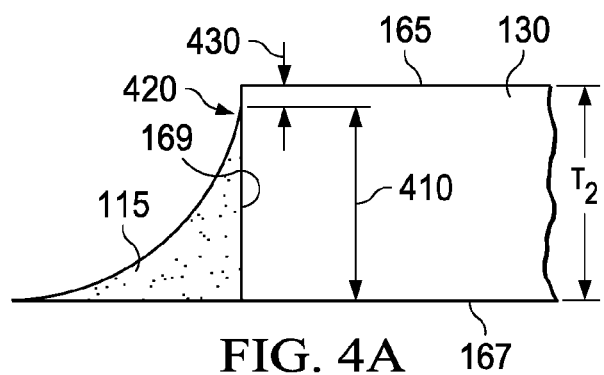

FIG. 4A illustrates a detail view of the encapsulant 115 proximate the window 130 for the case that the device 105 is a DMD, e.g., the device 105 configured as illustrated in FIG. 1C. In the illustrated embodiment the encapsulant 115 forms a concave profile when viewed in cross-section. An elevation 410, determined relative to the bottom surface 167 of the window 130, describes the extent of coverage of the window side surface 169. The elevation 410 is a convenient value with which to represent the thermal contact between the encapsulant 115 and the window 130. Depending on the context, the elevation 410 may be expressed as a percentage, a fraction or an absolute distance. As illustrated, the elevation 410 is about 90% of a thickness $T_2$ of the window 130. If the window 130 is 1 mm thick, e.g., the elevation 410 is about 0.9 mm. Equivalently, the extent of coverage of the window 130 may be expressed as a distance 430 between the top surface 165 of the window 130 and the uppermost extent 420 of the encapsulant 115.

Figure 4B:
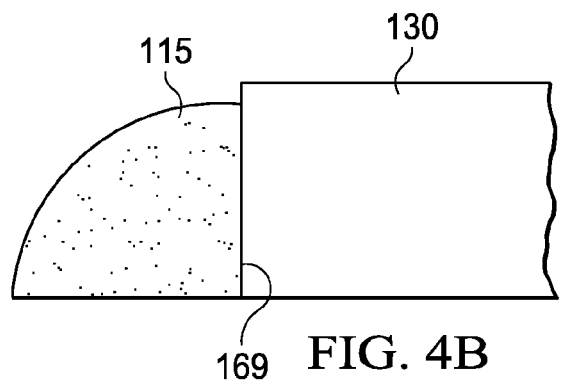

FIG. 4B illustrates an alternate embodiment in which the encapsulant 115 forms a convex profile when viewed in cross section. The convex profile includes more encapsulant material proximate the side surface 169 than do concave embodiments. The additional encapsulant material is expected to provide lower thermal resistance than does the concave profile illustrated in FIG. 4A. In some cases, the reduced thermal resistance may be beneficial to the objective of providing greater heat flow from the device 105 or reducing the operating temperature thereof. In other cases, the benefit of lower thermal resistance is outweighed by the additional cost or time of forming the convex profile. In such cases, it is generally preferred to use the concave profile of FIG. 4A.

Figure 5:
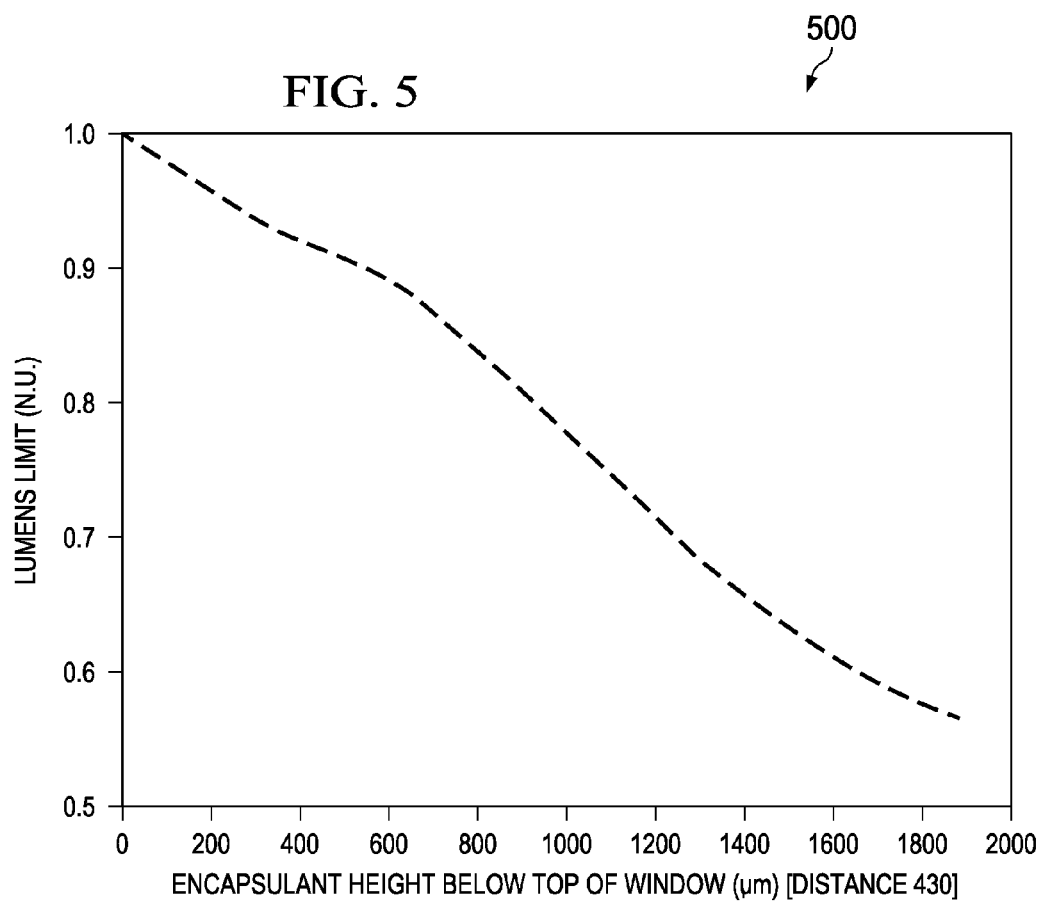
FIG. 5 illustrates an operational characteristic of a lumen limit of a packaged electronic device.

FIG. 5 illustrates a characteristic generally designated 500 between a maximum permitted luminosity ("lumens limit") of the light beam 135 and the distance 430. The characteristic 500 is presented for the purpose of illustration, without limiting the embodiments of the disclosure. The lumens limit is presented in normalized units from 0.5 to 1.0. As an illustrative example, the characteristic 500 was determined for the case that the electronic device 105 is configured as illustrated in FIG. 1C, with the thickness $T_1$ of the spacer 160 about 1 mm, and the thickness $T_2$ of the window about 1 mm. Thus, at a distance 430 of zero, the entire side surface 169 is covered by the encapsulant 115. At a distance 430 of 1000 µm, the window side surface 169 is uncovered. When the distance 430 is 2000 µm, the spacer side surface 168 and the window side surface 169 are both uncovered. The maximum permitted luminosity is that luminosity for which a specified temperature rise of the window 130 occurs. For example, a temperature rise of 50 C may be known to be associated with a minimum specified lifetime of the packaged device 100. In this case, the relationship 500 describes the luminosity of the light beam 135 that is associated with the specified lifetime, as a function of width of the uncovered portion of the side surfaces 168, 169 (e.g., the distance 430).

The relationship 500 illustrates that as distance 430 increases from zero (completely covering the side surfaces 168, 169) to about 1000 µm (at which the side surface 169 is completely uncovered), the normalized lumens limit decreases from unity to about 0.75. Restating this relationship, the lumens limit may increase by about 33% by placing the window side surface 169 in contact with the encapsulant 115.

The extent of coverage of the side surface 169 is in contrast with the conventional configuration 200 of the encapsulant 210, as illustrated in FIG. 2, e.g. Only a small amount of the side surface 169 of the window 130 may be in contact with the encapsulant 210. For example, a conventional process may result in about 100 µm to 200 µm of the uncured encapsulant covering the side surface 169 as a meniscus, e.g. Such a small amount of coverage is not generally sufficient to result in any significant increase of heat conduction from the window 130. Thus, the devices and methods of the disclosure provide a significant improvement over the conventional configuration.

Figure 6:
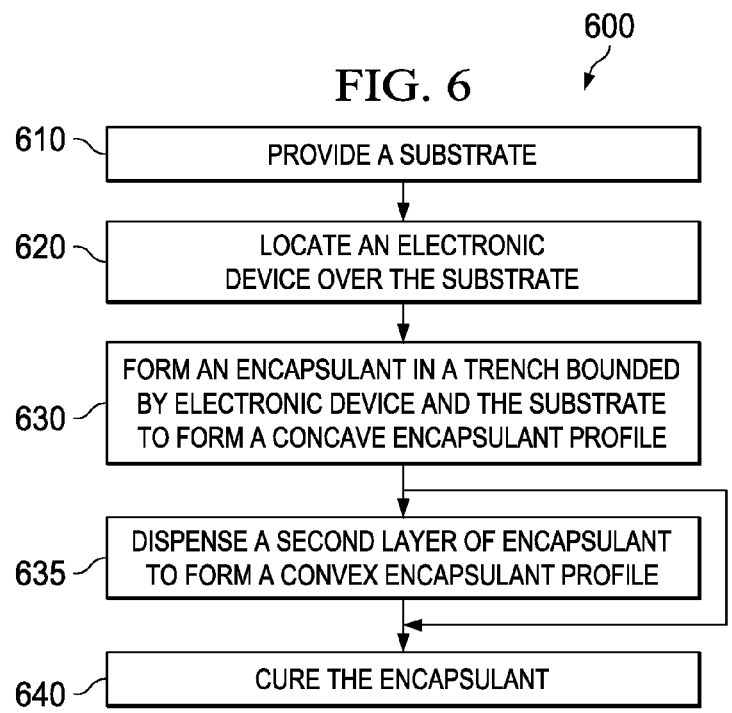
FIG. 6 illustrates a method.

Turning now to FIG. 6, illustrated is a method generally designated 600 of forming an electronic device. In describing the method 600, continuing reference is made to FIGS. 1A-1D, 4A, and 4B as nonlimiting examples to provide clarity to the description. The method begins with a step 610, in which the substrate 110 is provided and includes the well 150 formed therein. As used herein, "provided" means that the substrate 110 is obtained from any source, including from a supplier external to a business unit performing the method, or from a manufacturing process performed by the business unit.

In a step 620, the electronic device 105 is located over the substrate 110. The electronic device 105 may be any device with a thickness greater than the depth 330 of the well 150. In some embodiments, the electronic device 105 includes a glass window, such as the window 130, the top surface 165 of which is at a greater height above the lower surface 152 of the well 150 than the depth 330 of the well 150. The locating forms a trench, e.g., the trench 120 as illustrated, e.g., in FIG. 1D.

Figure 7:
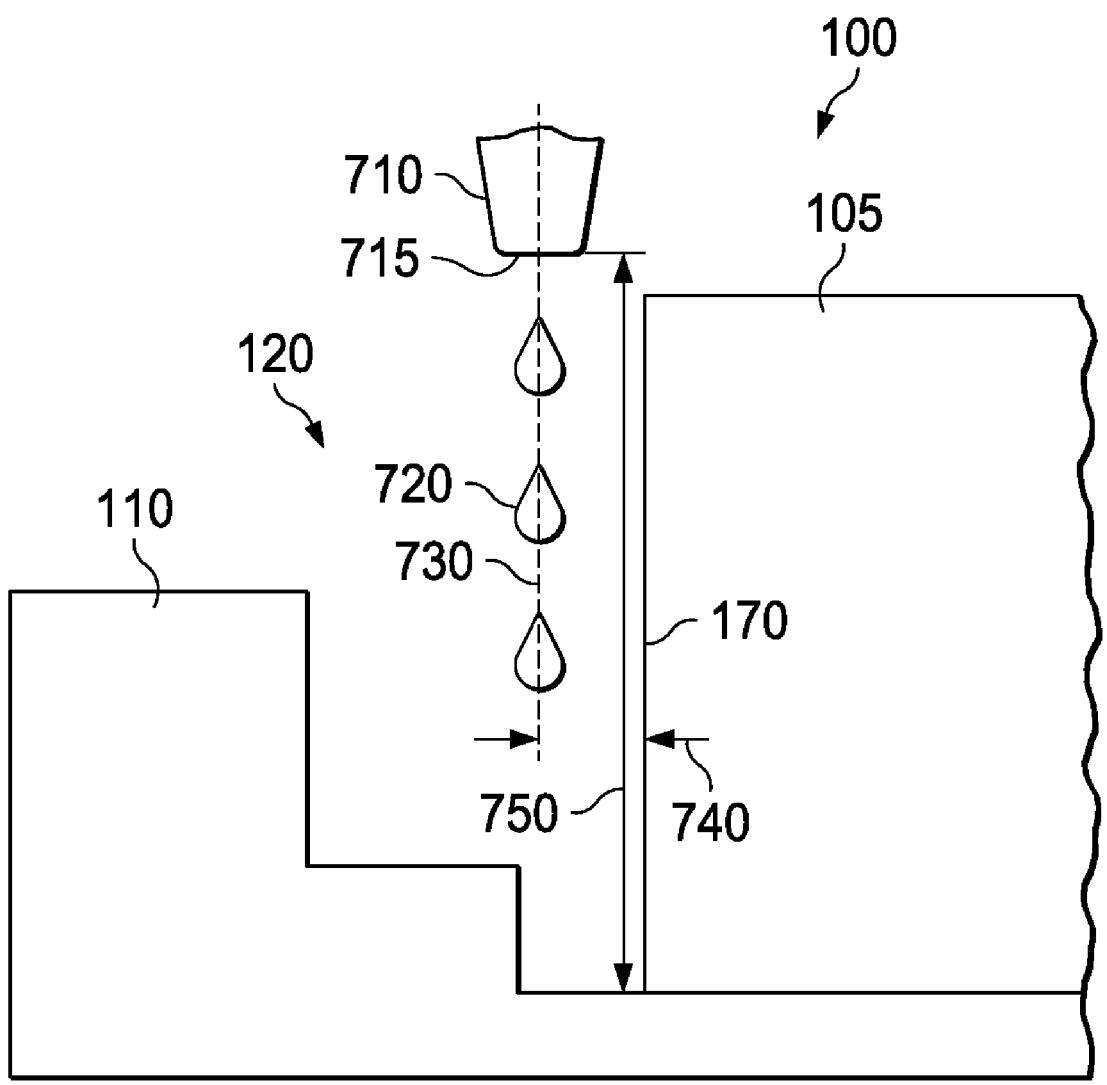
FIGS. 7 and 8 illustrate an embodiment of a method of dispensing of an encapsulant.
Figure 8:
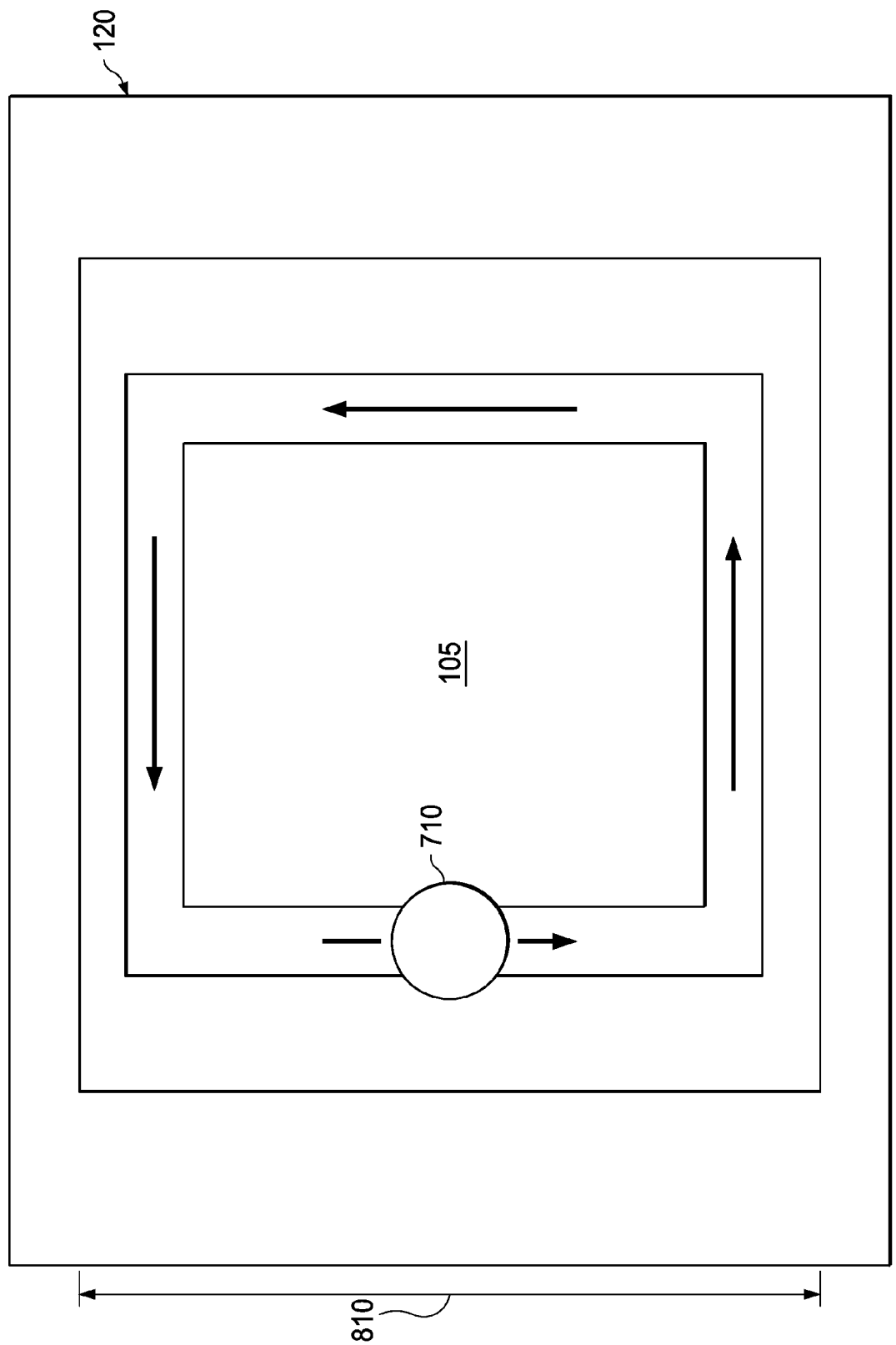

In a step 630, an encapsulant, e.g., the encapsulant 115, is placed in the trench 120 in an uncured form. Reference is made to FIGS. 7, and 8 in the following description of the placement of the uncured encapsulant. Continuing reference is made to the elements of previous figures as appropriate. FIG. 7 illustrates a sectional view of a portion of the packaged device 100 formed according to the disclosure during deposition of the encapsulant. A nozzle 710 with an orifice 715 is positioned over the trench 120 and configured to dispense droplets 720 of the uncured encapsulant. The nozzle 710 is positioned such that a dispensing axis 730 is positioned with a distance 740 from the device sidewall 170 of the electronic device 105.

An objective of the method 600 is to dispense the uncured encapsulant in a manner that results in the asymmetric profile illustrated, e.g., in FIG. 4A. This is contrary to known conventional dispensing methods, which result in a generally symmetric profile such as that shown by the encapsulant 210 in FIG. 2. Moreover, surface tension of the uncured encapsulant generally favors a profile that minimizes the surface area of the uncured encapsulant in the trench 120, contributing to the symmetric profile of the encapsulant 210.

The method 600 benefits from the recognition that the rheological and cohesive properties of the uncured encapsulant may be advantageously balanced against the tendency of the uncured encapsulant to form a profile with a minimum surface area. The rheological properties of the uncured encapsulant embody fluid dynamic considerations such as the viscosity and thixotropy of the uncured encapsulant. Thixotropy is, e.g., the shear rate-dependent change of viscosity of a fluid. The thixotropic characteristic of a material may be expressed as a thixotropic index, e.g., a ratio of the viscosity at one shear rate to the viscosity at another shear rate. Typically, a material with a non-unity thixotropic index has a lower viscosity at a higher shear rate, and a higher viscosity at a lower shear rate. Some uncured encapsulants have a non-unity thixotropic index. Thus, the viscosity during dispense of such an encapsulant will typically be lower than after the encapsulant flow rate reaches zero after it is dispensed.

The viscosity is generally a function of the temperature of the encapsulant, and is usually determined under standard conditions. Typically, the viscosity of an uncured encapsulant is greater at a lower temperature, and lesser and a higher temperature. Surface tension is also expected to affect the flow of the uncured encapsulant. A greater surface tension will result in a greater driving force to minimize the surface area of the uncured encapsulant. Finally, the cohesive force between the uncured encapsulant and a surface with which the uncured encapsulant is in contact will tend to resist the flow of the uncured encapsulant in a direction parallel to the surface. Thus, when the surface tension of the uncured encapsulant results in force on the uncured encapsulant parallel to the surface, the cohesive force will result in an opposing force.

In some embodiments, the pressure and temperature of the uncured encapsulant in the nozzle 710 may be selected to result in a desired initial viscosity of the uncured encapsulant when it lands in the trench 120. The temperature of the substrate 110 may be selected to result in a different second viscosity, related to the thixotropic index, of the uncured encapsulant on the substrate 110. The initial viscosity may be that determined to result in an advantageous droplet shape and velocity. The second viscosity may be that determined to be associated with an encapsulant flow rate after landing, and a balance between the surface tension of the uncured encapsulant and the cohesive force between the uncured encapsulant and the device sidewall 170, resulting in the concave profile of FIG. 4A, e.g.

In general, different formulations of uncured encapsulants have different fluid dynamical properties associated with each. Thus, a combination of the aforementioned process parameters that results in the desired profile may be different for different uncured encapsulant formulations. Moreover, the combination of parameters may be different on different dispensing tools. Also, those skilled in the pertinent art will appreciate the selection of a specific uncured encapsulant will be guided in part by package requirements such as, e.g., the coefficient of thermal expansion (CTE), glass transition temperature and chemical compatibility with various components.

It is believed that the properties of the encapsulant relevant to the various embodiments herein are primarily the standard viscosity and the thixotropic index. These properties are typically temperature-dependent. Thus, temperatures may be determined at which a particular encapsulant has a desired value of initial viscosity and second viscosity. Any encapsulant which has a desired value of thixotropic index, initial viscosity and second viscosity at temperatures compatible with other limitations described herein is within the scope of the disclosure.

In a non-limiting example, an encapsulant meeting the foregoing criteria has a thixotropic index in a range from about 0.8 to about 4, with a preferred value of about 1.3 or 2. The standard viscosity may range from about 8000 cP to about 100,000 cP as determined, e.g., by a spindle viscometer. While the method is thought to be relatively insensitive to a viscosity in this range, a viscosity of about 80,000 cP has been found to provide acceptable results. Encapsulants with these general characteristics may be obtained from many commercial sources known to those skilled in the pertinent arts.

In some embodiments, a jet dispensing tool is used to dispense the uncured encapsulant, as illustrated in FIG. 7. Without limitation, one example of a jet dispensing tool is the DispenseJet DJ-9000 manufactured by Asymtek, Carlsbad, Calif., USA. Specific embodiments of the method 600 are discussed further with reference to the DJ-9000. Those skilled in the pertinent art will appreciate that other tool sets may be used to produce results similar to those produced by the DJ-9000 using the process parameters disclosed herein. For example, an auger pump system with a dispensing needle may be used. When an auger system is used, the nozzle 710 may be considered to be a needle.

In addition to the aforementioned parameters, an additional parameter is relevant to operation of the DJ-9000. A pump stroke number characterizes the position of a piston that pressurizes and drives the uncured encapsulant to the nozzle orifice 715. The pump stroke number is a machine-specific setting that determines a position of a piston used to expel the droplets 720 of the uncured encapsulant. The DJ-9000 is configured such that the pump stroke number is associated with a pressure of the expelled fluid in pounds per square inch.

Another relevant parameter is the rate at which the nozzle 710 is translated with respect to the substrate 110 as the uncured encapsulant is dispensed. FIG. 8 illustrates a plan view of the substrate 110 with the electronic device 105 mounted thereover. An embodiment is illustrated in which the nozzle is translated with respect to the trench 120 with a side length 810 in a counterclockwise direction around the electronic device 105. In an embodiment, the translation rate is in a range that ensures continuous coverage of the uncured encapsulant in the trench 120 and on the device sidewall 170, but does not overflow the trench 120. In general, the rate range is determined in part by the width and depth of the trench 120, and the mass and the dispensing rate of the droplets 720.

In some embodiments, the dispensing process includes multiple passes of the nozzle 710, with each pass dispensing a portion of the total encapsulant. For example, in the illustrated embodiment of the well 120, a first pass may be configured to fill the narrowest portion of the well 120, a second pass may be used to fill the widest portion, and a third pass may form the concave profile of FIG. 4A, e.g., If the convex profile of FIG. 4B is desired, a fourth pass may be used.

To promote formation of the desired encapsulant profile, the nozzle 710 is positioned at the distance 740 such that the dispensing axis 730 is about 250 µm or less from the device sidewall 170. Positioning the nozzle 710 in this way promotes wetting of the device sidewall 170 with the encapsulant. In some cases, the dispensing axis 730 is 150 µm or less or even 100 µm or less, depending on, e.g., droplet size.

The distance 740 will generally be geometry-dependent, and differ for each pass. Those skilled in the pertinent art are capable of selecting the distance 740 appropriate for a particular device and substrate geometry. Care should be exercised in selecting the distance 740 for the pass that places the encapsulant in contact with the window side surface, e.g. If the distance 740 is too small, the encapsulant may overtop the device 105. If instead the distance 740 is too large, the encapsulant may fail to wet the surface and thus fail to produce the desired profile.

Finally, the mass (or equivalently the volume) of the dispensed encapsulant is selected to provide a desired quantity of encapsulant. In some cases, the dispensing tool may be programmed with a desired dispensing mass, and the tool will configure itself to provide the encapsulant at a dispensing rate and a nozzle 710 translation rate that results in the selected mass being dispensed over a desired distance of the well 120. For example, the DJ-9000 computes the droplet dispense rate (droplets/s, e.g.) and translation rate given a desired droplet 720 mass, a total dispense distance, and a total dispense mass.

Table I below enumerates a range of each process parameter and an example of a more specific combination of parameter values in one embodiment. Note that the range of values for each process parameter reflects the range of fluid dynamical properties of available uncured encapsulants for which the method 600 is expected to provide a profile as described herein. The example embodiment in Table I includes trench 120 dimensions, for illustration purposes only, as follows: the first width 171 is about 1.5 mm, the second width 172 is about 0.5 mm, the first depth 173 is about 0.8 mm, and the second depth 174 is of about 1.1 mm; the trench side length 810 is about 2 cm.

TABLE I

| Parameter | Range | Example Embodiment |
|---|---|---|
| Uncured Encapsulant Type | Epoxy | Glob top |
| Fluid Pressure | 34-207 kPa | 60-90 kPa |
| Pump Stroke Number | 5-30 | 6-12 |
| Nozzle 710 Temperature | 24-100 C. | 50-80 C. |
| Substrate Temperature | 24-150 C. | 70-100 C. |
| Distance 740 for the pass that places encapsulant in contact with the side surface 169 | Geometry-dependent | 80-150 µm |
| Droplet Mass | 0.1-0.7 mg | 0.2-0.5 mg |
| Number of passes | Geometry-dependent | 3 |
| Total Dispensed Mass | 5 mg-500 mg | Pass 1: 30-50 mg<br>Pass 2: 90-120 mg<br>Pass 3: 50-75 mg |

Returning to FIG. 6, in an optional step 635, a second quantity of uncured encapsulant may be dispensed to form a convex profile as illustrated in FIG. 4B. Finally, in a step 640, the encapsulant is conventionally cured following parameters provided by the manufacturer. Typically some shrinkage of the encapsulant occurs. However, such shrinkage, if present, does not significantly change the profile of the encapsulant 115.

The elevation 340 resulting from the step 630 is at least about 35% greater than the elevation 310. As described previously, the greater elevation 340 in contact with the electronic device 100 results in lower thermal resistance between the device 105 and the substrate 110 than would result from a conventional configuration of the encapsulant.

Those skilled in the art to which the disclosure relates will appreciate that other and further additions, deletions, substitutions and modifications may be made to the described embodiments without departing from the scope of the disclosure.

What is claimed is:

1. A packaged electronic device, comprising:
    a substrate having an upper surface interrupted by a well formed in said substrate, said well having a substrate bottom surface and a substrate sidewall;
    an electronic device located in said well over said substrate bottom surface and having a device top surface and a device sidewall;
    a trench bounded by said substrate bottom surface, said substrate sidewall and said device sidewall; and
    an encapsulant at least partially filling said trench and contacting said substrate sidewall and said device sidewall, said encapsulant having a first elevation on said substrate sidewall with respect to said substrate bottom surface and a second elevation on said substrate device sidewall with respect to said substrate bottom surface that is at least about 35% greater than said first elevation.

2. The electronic device package recited in claim 1, wherein said second elevation is at least about 50% greater than said first elevation.

3. The electronic device package recited in claim 1, wherein said second elevation is at least about 0.5 mm greater than said first elevation.

4. The electronic device package recited in claim 2 or 3, wherein said encapsulant covers at least about 85% of said device sidewall.

5. The electronic device package recited in claim 1, wherein said top surface is a top surface of a glass plate and said device sidewall includes a sidewall of said glass plate, and said encapsulant covers at least about 50% of said sidewall of said glass plate.

6. The electronic device package recited in claim 5, wherein said encapsulant covers at least about 0.5 mm of said glass plate sidewall.

7. The electronic device package recited in claim 5, wherein said encapsulant covers at least about 0.75 mm of said glass plate sidewall.

8. The electronic device package recited in claim 1, wherein said second elevation is at least about 50% greater than said first elevation.

9. The electronic device package recited in claim 1, wherein a surface of said encapsulant forms a concave surface.

10. The electronic device package recited in claim 1, wherein said electronic device comprises a digital reconfigurable mirror array.

11. A method of forming an electronic device, comprising:
    providing a substrate having a upper surface interrupted by a well formed in said substrate, said well having a lower surface and a substrate sidewall;
    locating over said substrate an electronic device having a device top surface and a device sidewall;
    dispensing an encapsulant in a trench bounded by said substrate lower surface and said substrate sidewall and said device sidewall, said encapsulant contacting said substrate sidewall and said device sidewall and having a first elevation from an uppermost point at which the encapsulant contacts the substrate sidewall to a lower surface of the trench and a second elevation from an uppermost point at which the encapsulant contacts the device sidewall to the lower surface of the trench, wherein the second elevation is at least about 35% greater than said first elevation.

12. The method as recited in claim 11, wherein said forming includes setting said substrate to a first temperature and an uncured encapsulant to a different second temperature, and placing said uncured encapsulant in said trench.

13. The method as recited in claim 12, wherein said second temperature is greater than said first temperature.

14. The method as recited in claim 11, wherein said device sidewall includes a glass portion, and said encapsulant covers at least about 50% of said glass portion.

15. The method as recited in claim 11, wherein said device sidewall includes a glass portion, and said encapsulant covers at least about 0.5 mm of said glass portion.

16. The method recited in claim 11, further comprising positioning a dispensing axis of said encapsulant about 250 [mu]m or less from said device sidewall during said dispensing.

17. The method recited in claim 12, further comprising forming said droplets using an Asymtek DispenseJet DJ-9000 dispenser.

18. A packaged digital reconfigurable mirror array comprising:
    a substrate having a upper surface interrupted by a well formed in said substrate, said well having a sidewall and a lower surface;
    a glass plate located over said well and having a sidewall, a top surface and a bottom surface, an elevation of said top surface above said well lower surface being greater than an elevation of said substrate upper surface above said well lower surface;
    a digital reconfigurable mirror array device located between said glass plate and said substrate;
    a trench located between said substrate sidewall and said glass sidewall; and
    an encapsulant at least partially filling said trench,
    wherein:
        said encapsulant forms a substrate contact point with said well sidewall and a device contact point with said glass plate sidewall; and
        an elevation of said device second contact point above said well lower surface is at least about 0.5 mm greater than an elevation of said substrate contact point above said well lower surface.

19. The reconfigurable mirror array package recited in claim 18, wherein said encapsulant covers at least about 50% of said glass sidewall.

20. The reconfigurable mirror array package recited in claim 18, wherein said encapsulant covers at least about 0.5 mm of said glass sidewall.

* * * * *